(12) United States Patent
Kainer et al.

(10) Patent No.: US 7,883,023 B1
(45) Date of Patent: Feb. 8, 2011

(54) FLUID MOVING DEVICE HAVING A FAIL-SAFE OPERATION

(75) Inventors: Lawton J. Kainer, Tomball, TX (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1046 days.

(21) Appl. No.: 11/699,397

(22) Filed: Jan. 29, 2007

(51) Int. Cl.
  *F24F 7/00* (2006.01)
  *G05D 23/00* (2006.01)
  *F24F 11/06* (2006.01)

(52) U.S. Cl. .................. 236/49.3; 236/51; 236/91 R; 165/247

(58) Field of Classification Search ............... 236/49.3, 236/51, 78 D, 78 B, 91 R; 165/214, 244, 165/247; 62/186
See application file for complete search history.

(56) References Cited

U.S. PATENT DOCUMENTS 5,682,949 A * 11/1997 Ratcliffe et al. ............. 165/209

FOREIGN PATENT DOCUMENTS

WO  WO 9746834 A1 * 12/1997

* cited by examiner

*Primary Examiner*—Chen-Wen Jiang

(57) ABSTRACT

In a method for operating a fluid moving device, the fluid moving device is operated under one of a local mode where the fluid moving device operates autonomously and a global mode where the fluid moving device operates based upon instructions received from a global controller, and where the fluid moving device is operated under the local mode as a fail-safe operation to the global mode.

17 Claims, 5 Drawing Sheets

FLUID MOVING DEVICE HAVING A FAIL-SAFE OPERATION

BACKGROUND

A data center may be defined as a location, for instance, a room that houses computer systems arranged in a number of racks. These racks are configured to house a number of computer systems which typically include a number of printed circuit boards (PCBs), mass storage devices, power supplies, processors, micro-controllers, and semi-conductor devices, that dissipate relatively significant amounts of heat during their operation.

Air conditioning units are typically used to cool heated air received from the computer systems and to supply the cooled air back to the computer systems. The cooled air is typically supplied through a series of vent tiles positioned above a plenum that directs airflow from the air conditioning units to the vent tiles. In some data centers, a plurality of air conditioning units are controlled by a central controller, such that, for instance, the air conditioning units are capable of being controlled under a global policy implemented by the central controller. These types of data centers are often beneficial because they typically enable the air conditioning units to operate under relatively optimized energy usage conditions.

However, when there is a failure in the central controller or in the communication path between the central controller and the air conditioning units, the air conditioning units typically shut down or fail to provide sufficient cooling resources to maintain the computer systems within desired conditions. These types of data centers are known to employ alarm monitoring systems, such that the personnel can manually adjust the air conditioning units should failures occur. Reliance upon alarm monitoring systems and manual adjustments, however, may result in damage to the computer systems due to the relatively long period of time required for the personnel make the manual adjustments.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a fluid moving device and a method for operating the fluid moving device. More particularly, a fluid moving device configured to operate under a global mode and a local mode and a method for operating the fluid moving device such that it enters into the local mode under various situations are disclosed herein. The fluid moving device may enter into the local mode from the global mode, for instance, in situations where a global controller, which operates the fluid moving device under the global mode, is unavailable. The global controller may be unavailable for a number of reasons, such as, the global controller may be inactive or damaged, the communication fabric over which the fluid moving device communicates with the global controller may be inactive or damaged, etc.

Through implementation of the fluid moving device and method disclosed herein, the fluid moving device may remain in an operational state in the event that the global controller is unavailable. The fluid moving device may additionally enter into the local mode even in situations where the global controller is available as an extra fail-safe.

Figure 1:
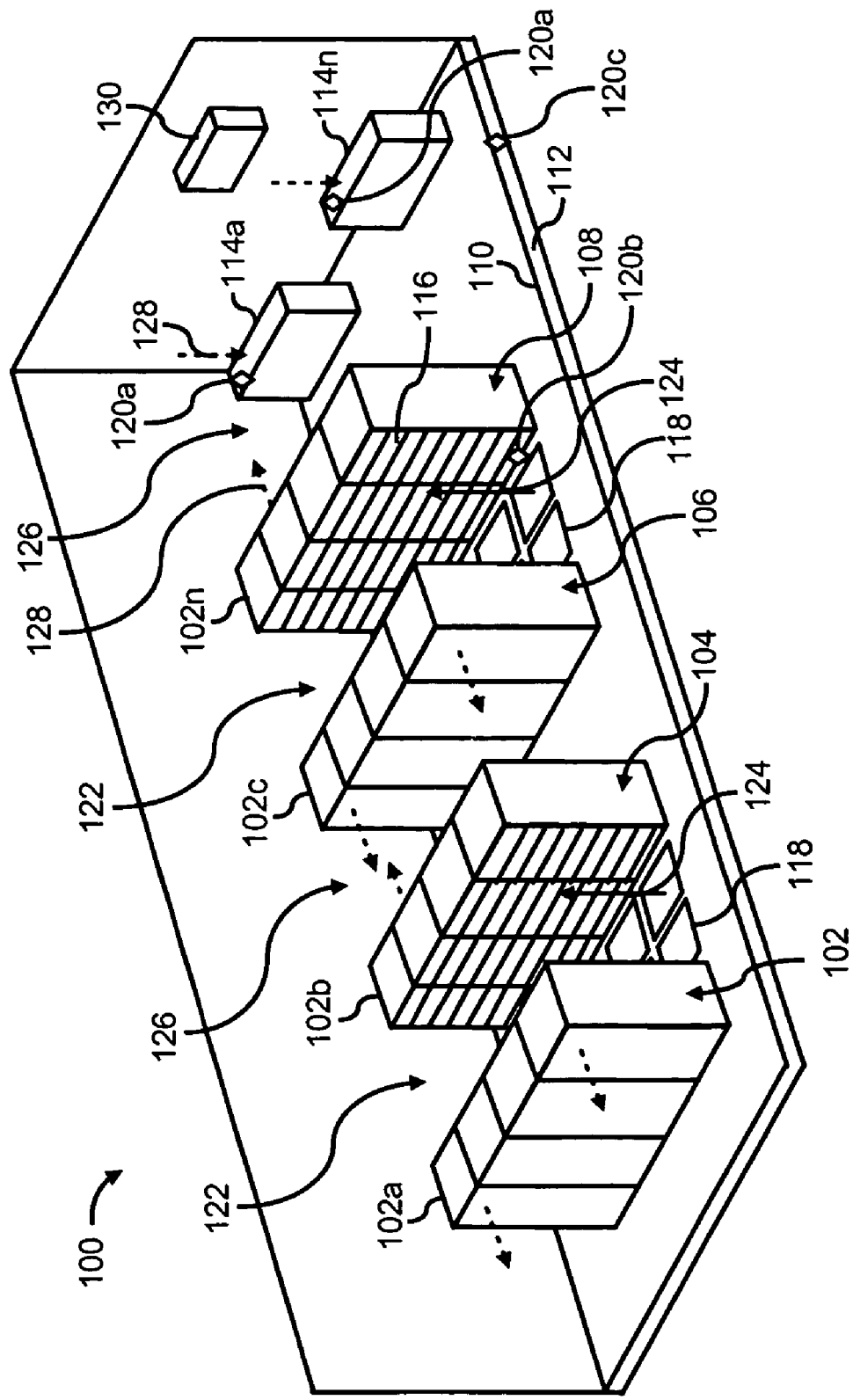
FIG. 1 shows a simplified perspective view of a data center which may employ a fluid moving device configured to operate under a normal mode and a fail-safe mode, according to an embodiment of the invention.

With reference first to FIG. 1, there is shown a simplified perspective view of a section of a data center 100, which may employ a fluid moving device configured to operate under a normal mode and a fail-safe mode. The terms "data center" are generally meant to denote a room or other space where one or more components capable of generating heat may be situated. In this respect, the terms "data center" are not meant to limit embodiments of the invention to any specific type of room where data is communicated or processed, nor should it be construed that use of the terms "data center" limits the invention in any respect other than its definition herein above.

The data center 100 is depicted as having a plurality of racks 102a-102n, where "n" is an integer greater than one. The racks 102a-102n are generally configured to house electronic devices 116 capable of generating/dissipating heat, for instance, computers, servers, bladed servers, disk drives, displays, etc. The electronic devices 116 may be operated to perform various electronic functions, for instance, computing, switching, routing, displaying, and the like.

The racks 102a-102n are depicted as being positioned on a raised floor 110, which may function as a plenum for delivery of cooled fluid, such as, air, refrigerant, water, etc., from one or more fluid moving devices 114a-114n, where "n" is an integer equal to or greater than one. As shown in FIG. 1, when the fluid comprises a gas, such as air or a gaseous refrigerant, the fluid is delivered through vents 118 to the racks 102a-102n. In other instances, when the fluid comprises a liquid, such as water, a liquid refrigerant, a multi-state refrigerant, etc., the fluid may be delivered to the racks 102a-102n through a series of pipes (not shown).

The fluid moving devices 114a-114n may supply fluid flow to a space 112 beneath the raised floor 110, and in certain instances may cool heated fluid (indicated by the arrows 128). In one regard, the fluid moving devices 114a-114n may comprise vapor-compression type air conditioning units, chiller type air conditioning units, etc. Examples of configurations suitable for use in the fluid moving devices 114a-114n may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

The fluid moving devices 114a-114n include respective actuators (not shown) configured to manipulate characteristics of the cooled fluid flow supplied to the racks 102a-102n, such as fluid flow temperature and supply rate. As such, the actuators include, for instance, devices for manipulating fluid flow temperature, such as chillers, heat exchangers, etc., and devices for manipulating the supply flow rates, such as variable frequency devices, blowers, etc., of the cooled fluid.

In the example depicted in FIG. 1, the cooled fluid, indicated by the arrows 124, is delivered from the space 112 to the racks 102a-102n through fluid delivery devices 118 located between some or all of the racks 102a-102n. The fluid delivery devices 118 may comprise, for instance, ventilation tiles, variable fluid flow volume devices, etc., and are shown as being located between rows 104a and 104b and 104c and 104d. Although the fluid delivery devices 118 and the space 112 have been depicted as being located on a floor of the data center 100, it should be understood that the fluid delivery devices 118 and the space 112 may be positioned on the ceiling or a wall of the data center 100 without departing from a scope of the invention.

The fluid moving devices 114a-114n are also depicted as including respective sensors 120a. In one regard, the sensors 120a may be integrated with respective fluid moving devices 114a-114n. In addition, or alternatively, the fluid moving devices 114a-114n may receive condition information detected by sensors 120b, 120c located remotely from the fluid moving devices 114a-114n. As shown in FIG. 1, a sensor 120b is positioned to detect conditions near an inlet of a rack 102a. Alternatively, however, the sensor 120b may be positioned to detect conditions inside or at an outlet of the rack 102a. Also shown in FIG. 1, a sensor 120c is positioned to detect conditions inside of the space 112.

The fluid moving devices 114a-114n may employ conditions detected by respective sensors 120a-120c in determining whether to change one or more characteristics of the fluid flow supplied by the air moving devices 114a-114n. By way of example, the fluid moving devices 114a-114n may be configured to vary the rate at which fluid is supplied if the detected condition exceeds a predetermined threshold. Thus, when the sensor 120b, 120c is located remotely from the fluid moving device 114a, the fluid moving device 114a may receive conditions detected by the sensor 120b, 120c and may vary one or more characteristics of the airflow that affects the location of that sensor 120b. In one regard, the fluid moving devices 114a-114n may employ the conditions directly in making the determinations. In another regard, the fluid moving devices 114a-114n may track how the conditions have changed over time or how the conditions vary for different areas of the data center 100 in making the determinations. In a further regard, the fluid moving devices 114a-114n may base the determinations on parameters calculated from the measured conditions.

In one example, the sensors 120a-120c may comprise any reasonably suitable device configured to detect one or more of temperature, pressure, humidity, fluid flow velocity, etc. In another example, the sensors 120a-120c may be designed to detect or signal other conditions, such as, loss of communication, overheating of bearings, leaks, head pressure rises, etc. In any regard, the sensors 120a-120n have been represented as diamonds to better distinguish them from other elements depicted in FIG. 1.

The fluid moving devices 114a-114n may be networked with a global controller 130 over a communication fabric. As described in greater detail below, the global controller 130 may be configured to control the fluid moving devices 114a-114n such that they operate under a global control scheme. The global control scheme may include, for instance, a control scheme in which the fluid moving devices 114a-114n are operated to substantially minimize the amount of energy consumed by the fluid moving devices 114a-114n in cooling the electronic devices 116. As another example, the global control scheme may include a control scheme in which the fluid moving devices 114a-114n are operated to substantially' minimize hot spot and/or cold spot formation in the data center 100. As a further example, the global control scheme may include a control scheme in which the fluid moving devices 114a-114n are operated to comply with provisions in service level agreements.

Although specific global control scheme examples have been provided, it should readily be understood that the global controller 130 may control the fluid moving devices 114a-114n under various other schemes without departing from a scope of the invention. An example of a suitable global control scheme is described in commonly assigned and co-pending U.S. patent application Ser. No. 10/078,087, entitled "Commissioning of Sensors", filed on Mar. 11, 2005, the disclosure of which is hereby incorporated by reference in its entirety.

Figure 2:
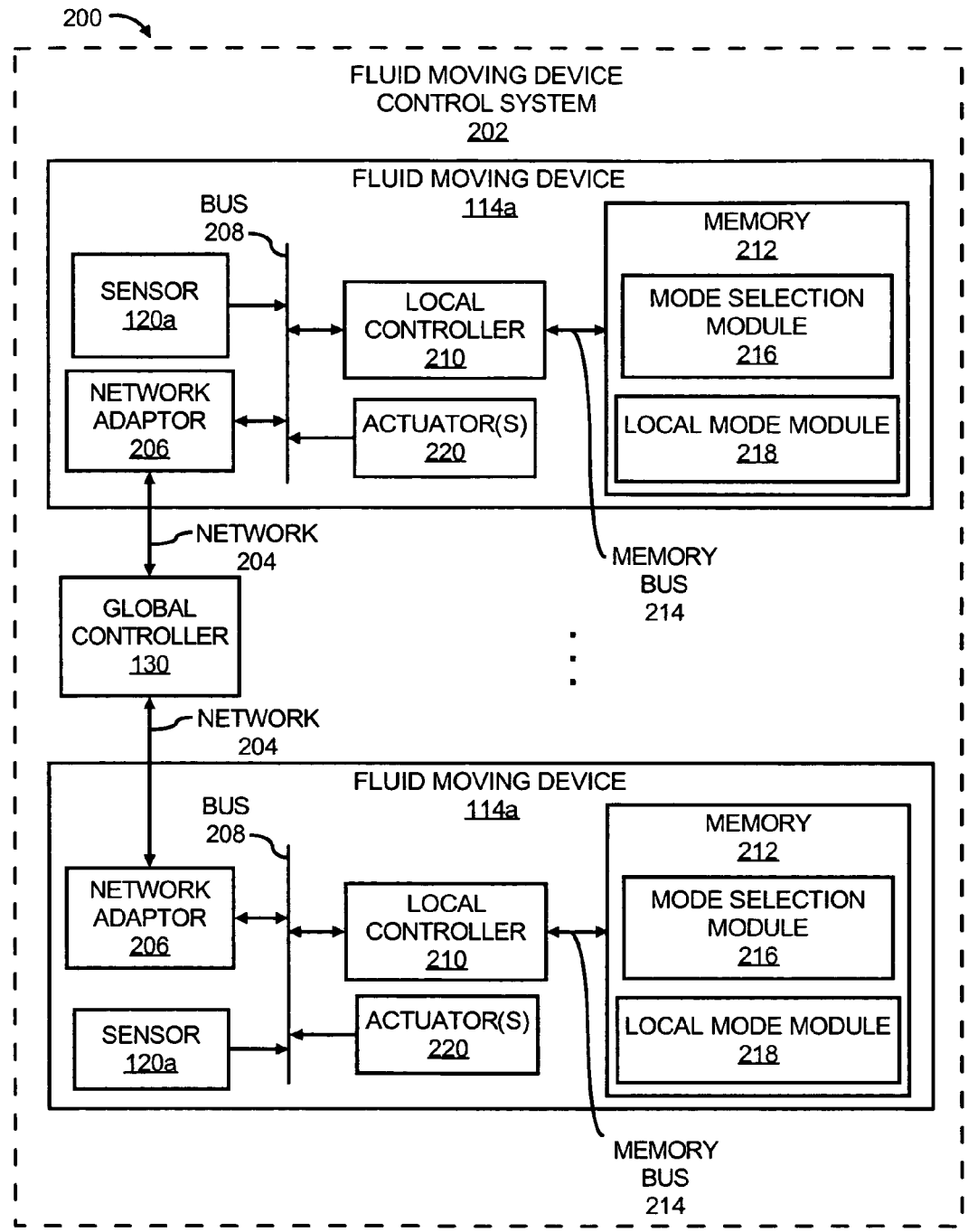
FIG. 2 is a block diagram of a system for controlling one or more fluid moving devices, according to an embodiment of the invention.

FIG. 2 is a block diagram 200 of a system 202 for controlling one or more fluid moving devices 114a-114n, according to an example. It should be understood that the following description of the block diagram 200 is but one manner of a variety of different manners in which such a system 202 may be configured. In addition, it should be understood that the system 202 may include additional components and that some of the components described herein may be removed and/or modified without departing from the scope of the system 202.

As shown, the system 202 includes the global controller 130 depicted in FIG. 1. As described hereinabove, the global controller 130 is configured to perform various functions in the data center 100, such as, to control the fluid moving devices 114a-114n such that they operate under a global control scheme. In this regard, the global controller 130 may comprise a computing device, for instance, a computer system, a server, etc. In addition, the global controller 130 may comprise a microprocessor, a micro-controller, an application specific integrated circuit (ASIC), and the like, configured to perform various processing functions. In addition, or alternatively, the global controller 130 may comprise software operating in any of a number of computing devices.

Although not shown, the global controller 130 may be interfaced with a memory configured to provide storage of software, algorithms, and the like, that provide the functionality of the global controller 130. Thus, for instance, the global control scheme for the fluid moving devices 114a-114n may be stored as an algorithm in the form of software on the memory, which the global controller 130 may access in making control decisions.

In addition, or alternatively, the global controller 130 may receive information from one or more sensors 120a-120c, without data from the sensors 120a-120c first going through the fluid moving devices 114a-114n. In this regard, one or more of the sensors 120a-120c may communicate directly with the global controller 130 such that the data collected by those sensors 120a-120c may be used by the global controller 130 in implementing a global control scheme.

The global controller 130 is further illustrated as being in communication with a plurality of fluid moving devices 114a-114n, where "n" is an integer greater than one, over a network 204. Although not shown, the global controller 130 may be equipped with or have access to software and/or hardware to enable the global controller 130 to transmit data to and receive data from the fluid moving devices 114a-114n over the network 204. The network 204 generally represents a wired or wireless structure in the data center 100 for the transmission of data between the various components of the system 202. The network 204 may comprise an existing network infrastructure or it may comprise a separate network configuration installed for the purpose of communicating data between the global controller 130 and the fluid moving devices 114a-114n.

As further shown in FIG. 2, each of the fluid moving devices 114a-114n is depicted as including a network adaptor 206, which provides respective interfaces between the fluid moving devices 114a-114n and the network 204. Each of the network adaptors 206 is depicted as being connected to a communication bus 208 that operates to couple the various components of the respective fluid moving devices 114a-114n to each other.

Also shown as being connected to the bus 208 is a sensor 120a, which may comprise any reasonably suitable device configured to detect at least one condition, as described above. A local controller 210 may receive information communicated over the communication bus 208 from either or both the network adaptor 206 and the sensor 120a. The local controllers 210 of the fluid moving devices 114a-114n may perform various functions in the fluid moving devices 114a-114n, and may include microprocessors, micro-computing devices, application specific integrated circuits (ASIC), or the like, configured to perform various processing functions.

The local controllers 210 are depicted as being connected to respective memories 212 through respective memory buses 214. However, in various instances, the memory 212 of a fluid moving device 114a may form part of the local controller 210 without departing from a scope of the system 202. Generally speaking, the memories 212 of each of the fluid moving devices 114a-114n are configured to provide storage of software, algorithms, and the like, that provide the functionalities of the respective local controllers 210. The memories 212 may be implemented as a combination of volatile and nonvolatile memory, such as DRAM, EEPROM, MRAM, flash memory, and the like. In addition, or alternatively, the memories 212 may comprise devices configured to read from and write to a removable media, such as, a floppy disk, a CD-ROM, a DVD-ROM, or other optical or magnetic media.

Although the local controllers 210 and memories 212 are depicted as being integrally formed with their respective fluid moving devices 114a-115, various principles of the fluid moving device control system 202 may be employed in instances where the fluid moving devices 114a-114n are not originally equipped with local controllers 210 and memories 212. In these instances, external controllers and memories (not shown), such as, programmable logic controllers or other computing devices, may be connected to the fluid moving devices 114a-114n to perform the functions of the local controllers 210 and memories. In addition, or alternatively, external controllers and memories configured to perform the functions of the local controllers 210 and memories 212 discussed herein may be employed as additional controllers and memories to existing local controllers and memories in situations where the existing controllers and memories are not programmed to perform the functions of the local controllers 210 and memories 212. As such, references to the local controllers 210 and memories 212 herein are intended to also pertain to controllers and memories located externally to the fluid moving devices 114a-114n.

The memories 212 are also each depicted as including a mode selection module 216 and an local mode module 218. Generally speaking, the local controllers 130 may invoke or otherwise implement the mode selection module 214 to select between at least two modes under which the fluid moving devices 114a-114n are to operate at any given time. As described in greater detail herein below with respect to the following flow diagrams, the mode selection module 214 may be implemented to select the mode based upon a condition detected by the sensor 120a.

One of the modes may be considered as a global control mode, in which, the fluid moving devices 114a-114n are operated according to instructions received from the global controller 130. More particularly, for instance, instructions received from the global controller 130 may be implemented to control one or more of actuators 220 of the fluid moving devices 114a-114n. The actuators 220 may include, for instance, devices for manipulating fluid flow temperature, such as chillers, heat exchangers, etc., and devices for manipulating the supply flow rates, such as variable frequency devices, blowers, etc., of the cooled fluid.

Another mode may be considered as a local mode, in which, the fluid moving devices 114a-114n are operated according to respective local control schemes for the fluid moving devices 114a-114n. A local control scheme may comprise a control scheme in which the local controller 210 controls the actuators 220 according to programming which substantially enables the fluid moving devices 114a-114n to operate in desired manners when, for instance, communications with the global controller 130 have been severed. Communications between the global controller 130 and the fluid moving devices 114a-114n may become severed under a number of different scenarios, such as, for instance, if the network 204 becomes in-operational, if the global controller 130 shuts down, if a network adaptor 206 malfunctions, etc.

As described in greater detail herein below, the local controller 210 may invoke or otherwise implement the local mode module 218 in response to one or more conditions detected by the sensor 120a. In invoking or implementing the local mode module 218, the local controller 210 may operate the actuators 220 to maintain conditions within the local control of a fluid moving device 114a-114n within predetermined levels.

Figure 3:
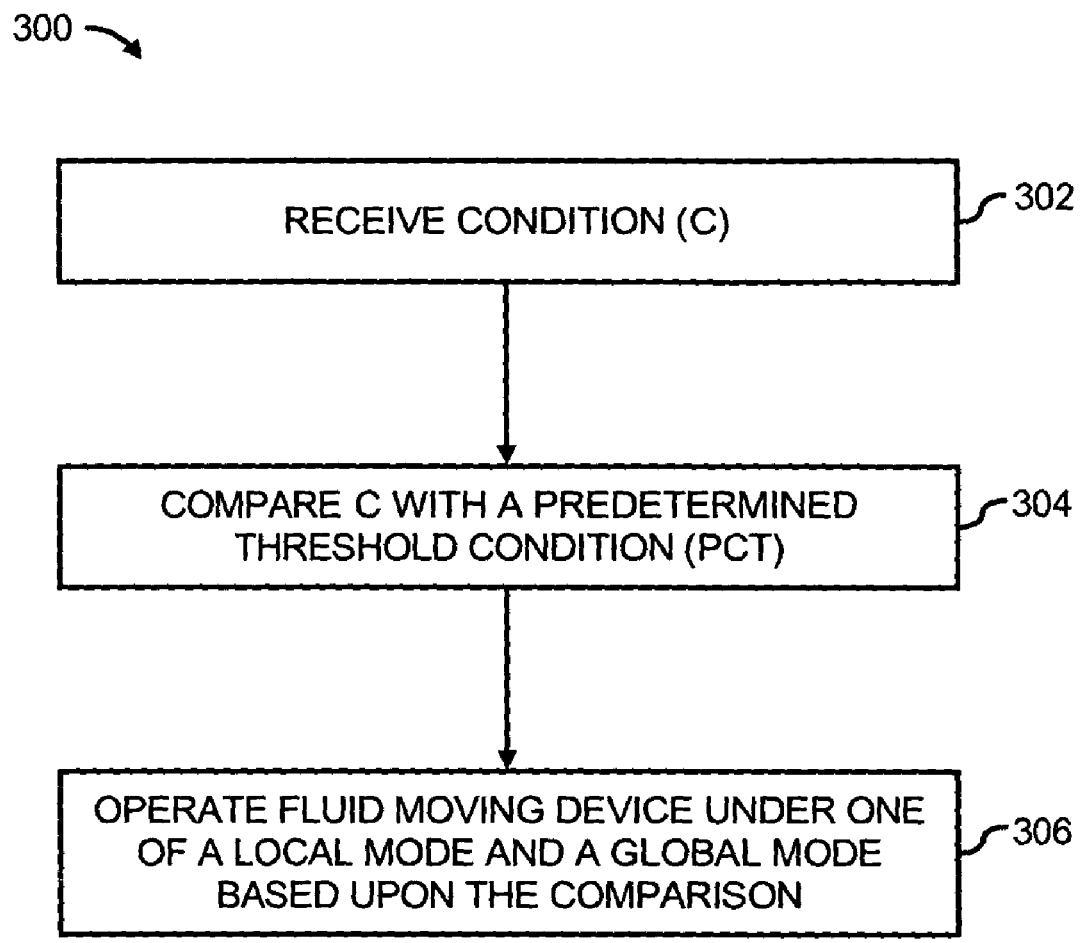
FIG. 3 illustrates a flow diagram of a method for operating a fluid moving device, according to an embodiment of the invention.

With reference now to FIG. 3, there is shown a flow diagram of a method 300 for operating a fluid moving device 114a, according to an example. It should be apparent to those of ordinary skill in the art that the method 300 represents a generalized illustration and that other steps may be added or existing steps may be removed, modified or rearranged without departing from a scope of the method 300.

The description of the method 300 is made with reference to the block diagram 200 illustrated in FIG. 2, and thus makes reference to the elements cited therein. It should, however, be understood that the method 300 is not limited to the elements set forth in the block diagram 200. Instead, it should be understood that the method 300 may be practiced by a system having a different configuration than that set forth in the block diagram 200. In addition, although particular reference is made solely to the fluid moving device 114a, it should be understood that the discussions presented herein may also pertain to one or more of the other fluid moving devices 114b-114n.

The method 300 may be implemented to operate a fluid moving device 114a under both a normal operating condition and a fail-safe operation condition. The normal operating condition may be defined as an operating state in which the global controller 130 implements a global policy to control the fluid moving device 114a as well as other fluid moving devices 114b-114n (global mode). The fail-safe operating condition generally comprises an operating state in which the local controller 210 implements a local control scheme (local mode).

As discussed in greater detail herein below, the local controller 210 may implement the local mode when a condition detected by a sensor 120a exceeds or falls below a predetermined condition threshold, depending upon the nature of the condition detected. For instance, if the detected condition comprises temperature, the local mode may be implemented when the detected temperature exceeds the predetermined condition threshold.

In another example, the local controller 210 may implement the local mode when the local controller 210 determines that the global controller 130 is unavailable, regardless of whether the detected condition exceeds the predetermined condition threshold. The global controller 130 may be deemed unavailable, for instance, if the global controller 130 becomes inactive or a communication path between the global controller 130 and the fluid moving device 114a is damaged or otherwise is inactive.

With particular reference back to the method 300 depicted in FIG. 3, the local controller 210 may receive a condition as indicated at step 302. In one example, the local controller 210 may receive the condition from a sensor 120a positioned to detect the temperature of fluid flow returning into the fluid moving device 114a.

In another example, the local controller 210 may receive the condition from a sensor 120b, 120c located remotely from the fluid moving device 114a. In this example, the fluid moving device 114a may be configured to vary one or more conditions in the vicinity of the remotely located sensor 120b, 120c. The sensor 120b, 120c may comprise, for instance, a temperature sensor, a pressure sensor, a humidity sensor, a fluid flow velocity sensor, etc. In addition, or alternatively, the sensors 120a-120c may be designed to detect or signal other conditions, such as, loss of communication, overheating of bearings, leaks, head pressure rises, etc.

In any regard, at step 304, the local controller 210 may compare the received condition with a predetermined condition threshold (PCT). The PCT may be set according to a number of factors and may depend upon the type of condition received by the local controller 210. For instance, the PCT may be based upon operating conditions of the fluid moving device 114a required to maintain the conditions at one or more detected locations within recommended settings for the electronic devices 116. As such, for instance, the PCT may be set within a predetermined value from the required operating conditions. The PCT may, in addition, or alternatively, be set arbitrarily or it may be learned through a commissioning process or through an analysis of historical data. In another example, the PCT may comprise a percentage over a nominal allowable change (or absolute magnitude) of an environmental condition, such as, temperature, pressure, humidity, etc., of a deviation from a predefined metric, such as, an index of performance that quantifies the amount of re-circulation occurring at various locations of the data center 100, etc. An example of the index of performed is described in U.S. Pat. No. 7,051,946 to Cullen Bash et al., the disclosure of which is hereby incorporated by reference in its entirety.

In one example, the condition comprises temperature detected at an inlet of the fluid moving device 114a. Because the temperature of the fluid flow returning into the fluid moving device 114a is normally directly affected by the temperature of the fluid flow supplied by the fluid moving device 114a, the predetermined threshold temperature may comprise a setpoint temperature for the fluid moving device 114a. The setpoint temperature may include, for instance, a return temperature at which the fluid moving device 114a is configured to vary operations of at least one of its actuators 220, which may be based upon the desired temperature in the data center 100. In addition, or alternatively, the predetermined threshold temperature may be a predefined value from the setpoint temperature, such that the local controller 210 is not configured to always implement the local mode each time the detected temperature exceeds the setpoint temperature. In other words, the predefined value may provide a sufficient gap between the setpoint temperature and the predetermined condition threshold to substantially prevent the fluid moving device 114a from entering into the local mode each time the received condition exceeds the setpoint temperature.

In any regard, the local controller 210 may operate the fluid moving device 114a under one of the local mode and the global mode based upon the comparison between the received environmental condition and the predetermined condition threshold, as indicated at step 306. The local controller's 210 determination of which of the local mode and the global mode to implement is discussed in greater detail below with respect to the following figure.

Figure 4:
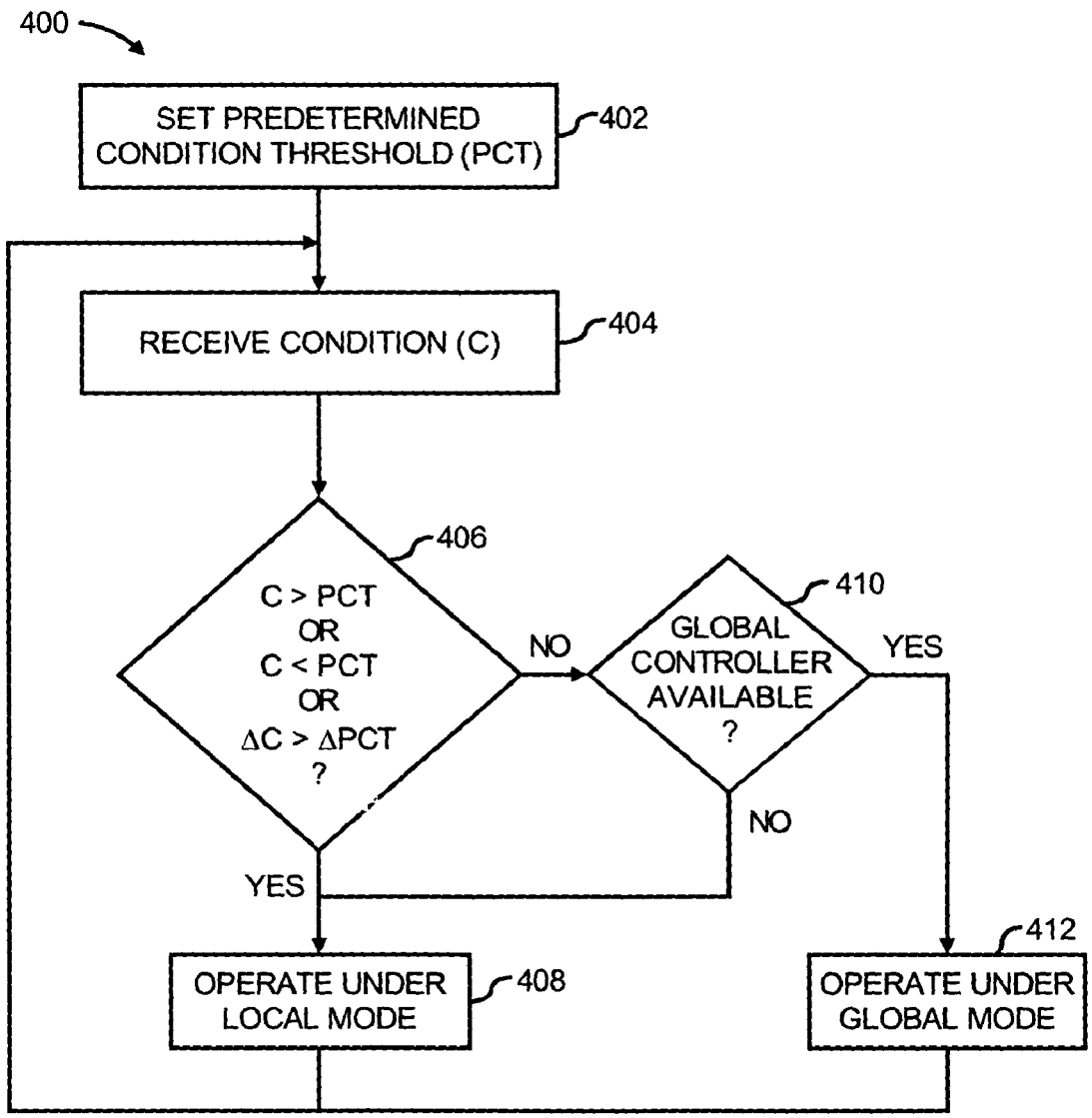
FIG. 4 illustrates a flow diagram of a method for operating a fluid moving device, which is a more detailed example of the method, according to an embodiment of the invention.

With respect now to FIG. 4, there is shown a flow diagram of a method 400 for operating a fluid moving device 114a, according to an example. The method 400 is similar to the method 300, but provides a more detailed example of the steps set forth in the method 300. It should be understood that the following description of the method 400 represents a generalized illustration and that other steps may be added or existing steps may be removed, modified or rearranged without departing from a scope of the method 400. Again, it should be understood that the discussions presented herein may also pertain to one or more of the other fluid moving devices 114b-114n.

At step 402, the predetermined condition threshold (PCT) discussed above at step 304 may be set.

At step 404, the local controller 210 may receive a condition (C) detected by a sensor 120a. In one example, the sensor 120a may be in relatively close proximity to the fluid moving device 114a, and may form part of the fluid moving device 114a. In another example, the sensor 120a may be located remotely from the fluid moving device 114a and may thus communicate detected condition information over a wired or wireless connection.

At step 406, the local controller 210 may compare the received econdition with the predetermined condition threshold (PCT). In a first example, the local controller 210 may determine whether the received condition exceeds the PCT. The local controller 210 may implement the first example in situations where the fluid moving device 114a is configured to maintain a condition below a predetermined level. For instance, the local controller 210 may implement the first example when the condition is temperature or humidity.

In a second example, the local controller 210 may determine whether the received condition falls below the PCT. The local controller 210 may implement the second example in situations where the fluid moving device 114a is configured to maintain a condition above a predetermined level. For instance, the local controller 210 may implement the second example when the condition is pressure or fluid flow supply rate.

In a third example, the local controller 210 may receive conditions pertaining to a first time and a second time at step 404. In addition, or alternatively, the local controller 210 may compute a rate of change between the condition pertaining to the second time and the condition pertaining to the second time (AC). The local controller 210 may, moreover, compare the computed rate of change with a predetermined condition change threshold (ΔPCT), as indicated at step 406. The local controller 210 may implement the third example to determine whether there is, for instance, a relatively rapid change in a detected environmental condition, without regard, for instance, to whether a detected environmental condition exceeds or falls below a predetermined condition threshold. In implementing the third example, therefore, the local controller 210 may detect relatively sudden changes, which may indicate that a problem exists in the data center 100.

In any respect, if the local controller 210 determines that one or more of the conditions analyzed at step 406 are true, which corresponds to a "yes" condition at step 406, the local controller 210 may operate the actuator(s) 220 of the fluid moving device 114a under the local mode, as indicated at step 408. Thus, for instance, the local controller 210 may control one or more actuators 220 to vary a condition around the sensor 120a. In addition, the local controller 210 may repeat steps 404 and 406 to determine whether the local mode should continue to be implemented.

If the local controller 210, however, determines that one or more of the conditions analyzed at step 406 are true, which corresponds to the "no" condition at step 406, the local controller 210 may determine whether the global controller 130 is available at step 410. At step 410, for instance, the local controller 210 may ping the global controller 130 to determine whether the global controller 130 is available. In this example, the local controller 130 may determine that the global controller 130 is not available if the local controller 130 fails to receive a response to the ping within a predetermined period of time. As another example, the global controller 130 may be configured to substantially continuously update a register that is located in the fluid moving device 114a, which the local controller 210 may access in determining whether the global controller 130 is available. In this example, the local controller 210 may determine that the global controller 130 is unavailable if the register has not been updated within a specified period of time.

In any regard, if the local controller 210 determines that the global controller 130 is unavailable at step 410, the local controller 210 may operate the fluid moving device 114a under the local mode as indicated at step 408. If, however, the local controller 210 determines that the global controller 130 is available, the local controller 210 may cause the fluid moving device 114a to operate under the global mode as indicated at step 412.

Following either of steps 408 and 412, the local controller 210 may repeat steps 404-412 to thereby substantially continuously provide fall back operation in the event that the global controller 130 becomes inactive or the communication fabric on which the global controller 130 and the local controller 210 communicate is disrupted.

Although not shown in FIG. 4, a user may manually override the method 400 to modify the predetermined condition threshold (PCT) or the predetermined condition change threshold (ΔPCT). As another example, the local controller 210 may learn to what level the predetermined condition threshold (PCT) or the predetermined condition change threshold (ΔPCT) should be set based upon a commissioning process or through normal operations, and may thus vary the predetermined condition threshold (PCT) or the predetermined condition change threshold (ΔPCT) as the local controller 210 performs multiple iterations of the method 400.

The operations set forth in the methods 300 and 400 may be contained as a utility, program, or subprogram, in any desired computer accessible medium. In addition, the methods 300 and 400 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
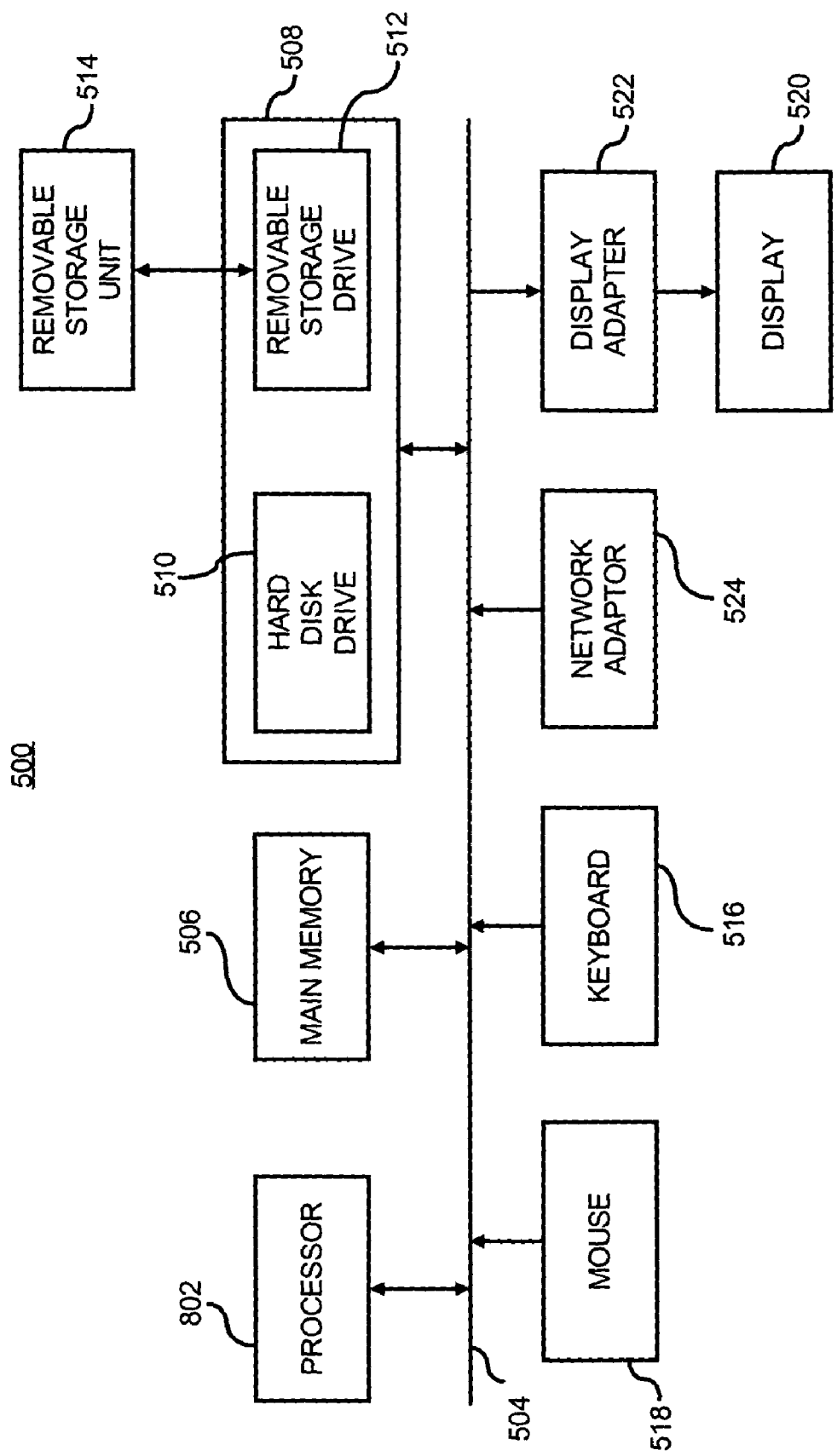
FIG. 5 illustrates a computer system, which may be employed to perform the various functions of the system for operating a fluid moving device disclosed herein, according to an embodiment of the invention.

FIG. 5 illustrates a computer system 500, which may be employed to perform the various functions of the local controller 210 described hereinabove, according to an embodiment. In this respect, the computer system 500 may be used as a platform for executing one or more of the functions described hereinabove with respect to the local controller 210.

The computer system 500 includes one or more controllers, such as a processor 502. The processor 502 may be used to execute some or all of the steps described in the methods 300 and 400. Commands and data from the processor 502 are communicated over a communication bus 504. The computer system 500 also includes a main memory 506, such as a random access memory (RAM), where the program code for, for instance, the local controller 210, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the sensor commissioning system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 802 may communicate over a network, for instance, the network 204 (FIG. 2), the Internet, LAN, etc., through a network adaptor 524.

It will be apparent to one of ordinary skill in the art that other known electronic components may be added or substituted in the computer system 500. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A method for operating a fluid moving device, said method comprising:
   receiving a condition;
   comparing the received condition with a predetermined condition threshold;
   operating the fluid moving device under one of a local mode and a global mode based upon whether the received condition one of exceeds and falls below the predetermined condition threshold, wherein the fluid moving device operates autonomously under the local mode and the fluid moving device operates based upon instructions received from a global controller under the global mode; and
   wherein operating the fluid moving device under the local mode further comprises operating the fluid moving device under the local mode as a fail-safe operation to the global mode.

2. The method according to claim 1, wherein the condition comprises temperature and the predetermined condition threshold comprises a predetermined threshold temperature, and wherein operating the fluid moving device under the local mode further comprises operating the fluid moving device under the local mode in response to the detected temperature exceeding the predetermined threshold temperature.

3. The method according to claim 1, wherein operating the fluid moving device further comprises operating the fluid moving device under the local mode in response to the detected condition falling below the predetermined condition threshold.

4. The method according to claim 3, wherein the condition comprises at least one of pressure and flow rate of fluid supplied by the fluid moving device, and wherein operating the fluid moving device under the local mode further comprises operating the fluid moving device under the local mode in response to at least one of the detected pressure and flow rate falling below the predetermined condition threshold.

5. The method according to claim 1, further comprising:
   determining whether the global controller is available in response to the detected condition falling below the predetermined condition threshold.

6. The method according to claim 5, further comprising:
   operating the fluid moving device under the global mode in response to the global controller being available; and
   operating the fluid moving device under the local mode in response to the global controller being unavailable.

7. The method according to claim 1, further comprising:
   receiving a condition pertaining to a first time and to a second time;
   computing a rate of change between the condition pertaining to the second time with the condition pertaining to the first time;
   comparing the computed rate of change with a predetermined threshold rate; and
   wherein operating the fluid moving device further comprises operating the fluid moving device under one of the local mode and the global mode based upon the comparison.

8. The method according to claim 7, wherein operating the fluid moving device further comprises operating the fluid moving device under the local mode in response to the rate of change exceeding the predetermined threshold rate.

9. A fluid moving device comprising:
   at least one actuator configured to vary a characteristic of fluid supplied by the fluid moving device, and
   a local controller configured to operate the at least one actuator under a local mode wherein the local controller operates autonomously, wherein the local mode is a fail-safe operation to the global mode, wherein the local controller is configured to receive a condition, and to compare the received condition with a predetermined condition threshold, wherein the at least one actuator is configured to be operated in one of the local mode and a global mode based upon whether the received condition one of exceeds and falls below the predetermined condition threshold, and wherein a global controller configured to control a plurality of fluid moving devices is configured to control the at least one actuator under the global mode.

10. The fluid moving device according to claim 9, wherein the received condition comprises temperature of fluid flow returned into the fluid moving device.

11. The fluid moving device according to claim 10, wherein the local controller is configured to implement the local mode in response to the detected temperature exceeding the predetermined condition threshold.

12. The fluid moving device according to claim 9, wherein the local controller is configured to determine whether the global controller is available in response to the received condition falling below the predetermined condition threshold, and wherein the local controller is configured to operate the at least one actuator under the local mode in response to the global controller being unavailable and to cause the at least one actuator to be controlled under the global mode in response to the global controller being available.

13. The fluid moving device according to claim 9, wherein the local controller is configured to determine whether the global controller is available in response to the received condition exceeding the predetermined condition threshold, and wherein the local controller is configured to operate the at least one actuator under the local mode in response to the global controller being unavailable and to cause the at least one actuator to be controlled under the global mode in response to the global controller being available.

14. The fluid moving device according to claim 9, wherein the local controller is configured to receive condition information pertaining to a first time and a second time;
   wherein the local controller is further configured to determine a rate of change between the condition detected at the second time with the condition detected at the first time, and to compare the rate of change with a predetermined threshold rate; and
   wherein the at least one actuator is configured to be operated under one of the local mode and the global mode based upon the comparison.

15. The fluid moving device according to claim 14, wherein the local controller is configured to operate the at least one actuator under the local mode in response to the rate of change exceeding the predetermined threshold rate.

16. A non-transitory computer readable storage medium on which is embedded one or more computer programs, said one or more computer programs implementing a method for operating a fluid moving device, said one or more computer programs comprising a set of instructions for:
   receiving a condition;
   comparing the received condition with a predetermined condition threshold; and
   operating the fluid moving device under one of a local mode and a global mode based upon whether the received condition one of exceeds and falls below the predetermined condition threshold, wherein the fluid moving device operates autonomously under the local mode and the fluid moving device operates based upon instructions received from a global controller under the global mode.

17. The non-transitory computer readable storage medium according to claim 16, said one or more computer programs comprising a further set of instructions for:

in response to the condition falling below the predetermined condition threshold, determining whether the global controller is available;

in response to the global controller being available, continuing to operate the fluid moving device under the global mode; and in response to the global controller being unavailable, operating the fluid moving device under the local mode.

* * * * *